United States Patent [19]
Prior

[11] Patent Number: 5,345,085
[45] Date of Patent: Sep. 6, 1994

[54] METHOD AND STRUCTURE FOR ELECTRONICALLY MEASURING BEAM PARAMETERS

[75] Inventor: Richard W. Prior, Fremont, Calif.

[73] Assignee: ETEC Systems, Inc., Hayward, Calif.

[21] Appl. No.: 37,964

[22] Filed: Mar. 26, 1993

[51] Int. Cl.⁵ .............................................. H01J 37/304
[52] U.S. Cl. ................................ 250/491.1; 250/397; 250/398; 250/492.22
[58] Field of Search ..................... 250/491.1, 397, 398, 250/492.22

[56] References Cited

U.S. PATENT DOCUMENTS

| | | | |
|---|---|---|---|
| 4,796,038 | 1/1989 | Allen et al. | 354/4 |
| 5,043,586 | 8/1991 | Giuffre et al. | 250/491.1 |
| 5,079,112 | 1/1992 | Berger et al. | 430/4 |
| 5,136,169 | 8/1992 | Smith et al. | 250/491.1 |

FOREIGN PATENT DOCUMENTS

62-272442 11/1987 Japan ................. 250/491.1

*Primary Examiner*—Jack I. Berman
*Attorney, Agent, or Firm*—Skjerven, Morrill, MacPherson, Franklin & Friel

[57] ABSTRACT

A method of electronically measuring parameters of an beam in a raster scan system includes the steps of: choosing a predetermined pixel to be calibrated, moving a grid adjacent this pixel, strobing the beam, incrementally moving the beam toward an axis of the grid, and integrating the signal resulting from the beam as the beam moves toward the axis. The steps of strobing the beam, incrementally moving the beam, and integrating the signal are repeated until the beam crosses the axis. The value of the accumulated signals, provided for example by a charge amplifier, is used to determine the relative position of the axis of the grid. The value of the accumulated signals associated with another axis is also determined. The relative positions of the two axes determine the relative location of the grid. If the grid location is known, the location of an associated substrate which is typically adjacent the grid is also known.

38 Claims, 11 Drawing Sheets

METHOD AND STRUCTURE FOR ELECTRONICALLY MEASURING BEAM PARAMETERS

BACKGROUND OF THE INVENTION

1. Field of the Invention

The present invention relates to measuring beam deflection errors, and in particular to a method and structure for electronically measuring scan deflection distortion.

2. Description of the Related Art

The manufacture of electronic integrated circuits relies heavily on the use of image projection techniques to expose resist-coated wafers with light or X-rays. The patterns formed by this exposure determine the various circuit connections and configurations. In certain applications, integrated circuit patterns are written directly onto resist-coated wafers in a process called electron-beam direct write.

In any exposure method, accuracy of the projected image is a prime consideration. This accuracy is particularly important in the manufacture of high density Random Access Memories (RAM) in which yield and ultimately the cost of the components depend heavily on meeting tight exposure placement requirements. Presently, electron beam lithography systems provide the most accurate method of placing the exposure patterns onto substrates for image projection techniques and for direct write techniques. A substrate is defined as a mask, wafer, or any similar material used in a semiconductor process. In electron beam lithography systems, beam position during exposure is critical to achieving and maintaining the tight performance tolerances required.

The electron beam position is conventionally controlled via a technique called raster scanning. In this method, the electron beam is repeatedly deflected in a continuous series of ramp deflections and flyback periods similar to a scanning technique used in televisions. Typically, the electron beam is deflected as rapidly as possible to minimize the time required to completely expose a pattern. In this manner, the production rate (i.e. throughput) is increased, and the unit cost per mask or wafer is lowered.

In a conventional system, the electron beam, which is typically a spot from 0.1 micron to 1 micron in diameter, is deflected over a range of several hundred microns and must be positioned within that range with an error of less than 0.01 microns, i.e. preferably a placement error of less than 1 part in ten thousand. This low placement error, coupled with a typical scanning rate of 30 kilohertz (KHz), make direct measurements of such signals exceptionally difficult.

Conventionally, the deflection signal is measured by its product, i.e., the patterns on the mask or wafer. Non-ideal pattern placement seen on the mask or wafer is identified through a series of measurements and tests, and appropriate modifications are then made to the deflection signal to correct these deficiencies. This method of modifying the performance of the deflection signal relies heavily on standard procedures of writing a pattern, processing the mask or wafer, and then measuring the accuracy of the patterns with proven, but relatively slow, metrology techniques. This process may require from one hour for a simple calibration to several weeks for a full calibration.

Preferably, calibration is performed without invoking the time-consuming process of writing and reading actual exposures of masks and wafers. "Real-time" characterization of electron beam parameters is achieved by scanning the electron beam at very low frequencies over a reference grid with known positions. This technique is well-known in the art and provides sufficient information to functionally calibrate an electron beam lithography system.

However, the correlation between these low frequency measurements and the actual beam writing deflection signal is not exact. Specifically, the high frequency writing signal introduces several anomalies in the electron beam which require further characterization via extensive pattern writing and reading. These anomalies include deflection axis crosstalk, slight deflection axis rotation effects, gain differences, and scan offsets, all of which vary as a function of scan frequency.

Because electron beam parameters are difficult to precisely predict via the above-described low frequency scanning technique, the previously-noted time-consuming method of writing and reading actual exposures is presently the only method to fully characterize the writing performance of lithography systems.

SUMMARY OF THE INVENTION

In accordance with the present invention, a method of electronically measuring parameters of a beam in a raster scan system includes the steps of: choosing a predetermined pixel to be calibrated, moving a grid adjacent this pixel, strobing the beam, incrementally moving the beam toward a first axis of the grid, and integrating the signal resulting from the beam as the beam moves toward the first axis. The steps of strobing the beam, incrementally moving the beam, and integrating the signal are repeated until the beam crosses the first axis. The value of the accumulated signal associated with the first axis is used to determine the relative position of the first axis of the grid.

The method of the present invention further includes performing the steps indicated above for a second axis of the grid. The value of the accumulated signals associated with the second axis is used to determine the relative position of the second axis of the grid. The relative positions of the first and second axes determine the relative location of the grid. This grid location is typically used to determine beam drift over a period of time or temperature. Specifically, if there is no beam drift, then the same applied deflection results in the same value of accumulated signals. Moreover, if the grid location is known, the location of an associated substrate which is typically adjacent the grid is also known.

In accordance with the present invention, an amplifier integrates the charge produced by the beam. In one embodiment of the invention, the amplifier is reset before integration, thereby improving the throughput of repeated measurements and minimizing the time period before a new measurement can be taken.

In another embodiment of the present invention, a plurality of contiguous pixels are chosen and the above-described grid includes reflective markings on the substrate. Thus, in this embodiment, the separate grid is eliminated. Because the beam measurement is taken on the substrate itself, this embodiment provides significantly increased accuracy compared to an embodiment including a separate grid.

In yet another embodiment of the present invention, a method of electronically measuring parameters of a beam in a raster scan system comprises the steps of: choosing a predetermined plurality of pixels to be calibrated, moving at least one reflective mark adjacent the plurality of pixels, strobing the beam, incrementally moving the beam toward the at least one reflective mark, and integrating the signals produced by the beam as the beam moves toward the at least one reflective mark. The steps of strobing, incrementally moving, and integrating are performed until the beam crosses the at least one reflective mark.

In one embodiment, the plurality of pixels are contiguous, whereas in other embodiments, the plurality of pixels includes a plurality of beam fingers linearly positioned. Typically, the reflective mark includes a plurality of reflective segments.

In accordance with the present invention, a method of electronically measuring parameters of a beam in a vector scan system comprises the steps of: choosing an origin position and a destination position, moving the beam between the origin position and the destination position, unblanking the beam at a predetermined time delay between moving from the origin position to the destination position, and repeating the steps of moving and unblanking for N times, where N is an integer. Then, the value of the predetermined time delay is incrementally increased. The steps of moving and unblanking for N times are repeated. The time delay is increased until the beam has settled at the destination position.

A beam parameter measurement system and method in accordance with the present invention provides significant advantages over prior art systems or methods. For example, the present invention allows operation at a normal deflection rate, i.e. the deflection rate used during resist exposure, thereby increasing positional accuracy determination. Moreover, because the present invention uses full speed deflection signals, the calibration process is accelerated, thereby significantly reducing the time and expense associated with a conventional calibration process. Furthermore, the present invention provides for integration of multiple charge packets, thereby allowing for the use of lower gain amplifiers which improves signal to noise performance.

DETAILED DESCRIPTION OF THE DRAWINGS

Beam drift measurements are periodically necessary during the substrate writing process to ensure an accurate electron beam placement. A typical raster scan line used during the substrate writing process consists of 2048 pixels per line or multiples thereof, depending on the equipment and the application. A method for measuring electron beam parameters in accordance with the present invention characterizes one pixel at a time. Thus, referring to FIG. 1, a first pixel is chosen in step 101 to be calibrated.

Figure 1:
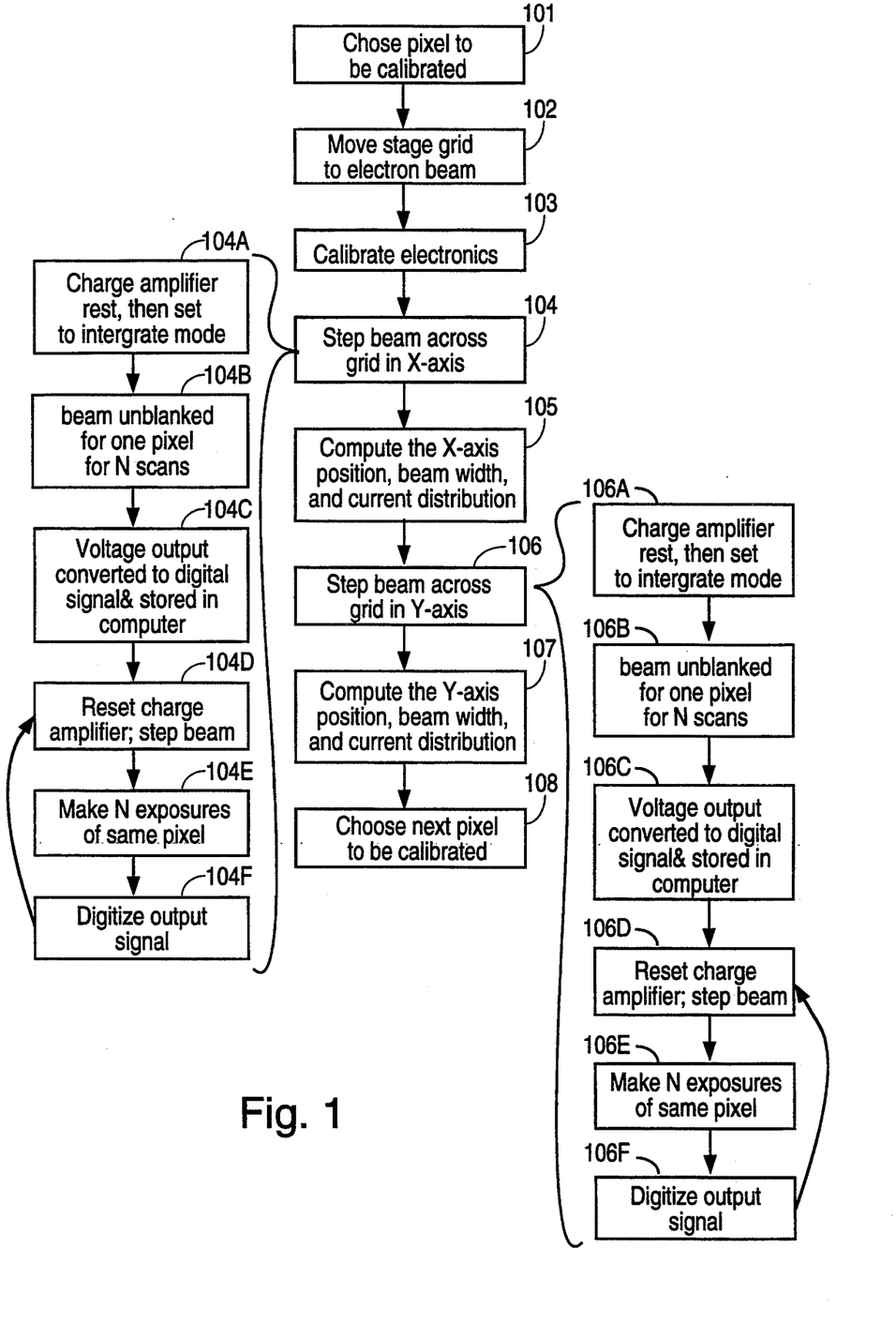
FIG. 1 shows a flow chart for a process in accordance with the present invention for calibrating deflection signals.
Figure 2:
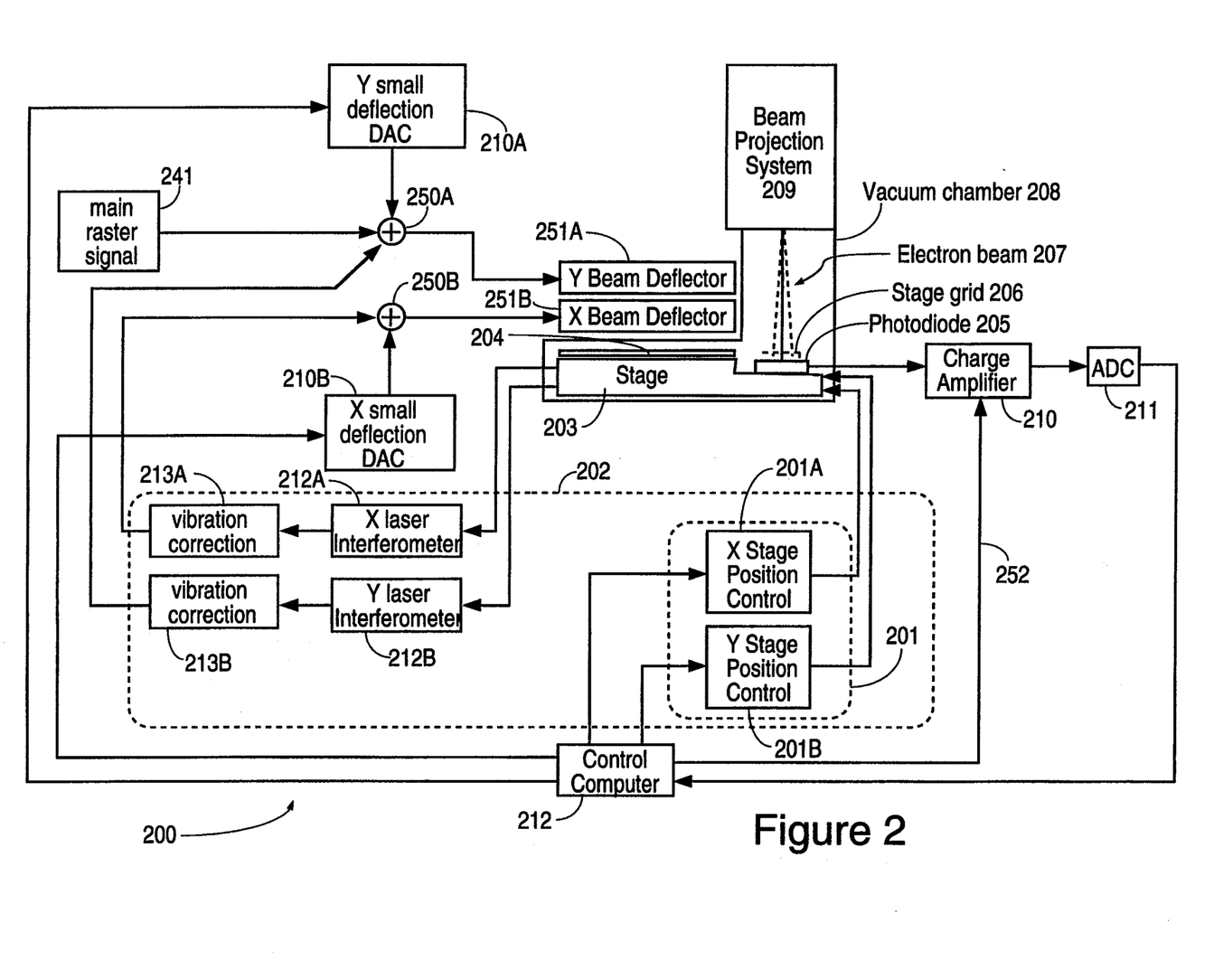
FIG. 2 illustrates a block diagram of a beam measurement system for an electron beam lithography system.

Referring to FIG. 2, a computer control 212, provided with information from a charge amplifier 210 (explained in detail below) via an analog to digital converter (ADC) 211, determines the drift of an electron beam 207. A stage position control 201 (including X stage position control 201A and Y stage position control 201B) positions a stage 203 under electron beam 207. During beam drift measurements, the resist of a substrate 204 is not exposed. Thus, during these beam drift measurements, stage 203, which supports substrate 204, an electron detector 205, and a stage grid 206, is moved such that stage grid 206 is positioned under electron beam 207 as indicated in step 102 (FIG. 1). Note that this electron beam location corresponds to the first pixel. Because stage grid 206 is intimately connected with stage 203 and hence substrate 204, any beam drift detected at stage grid 207 substantially corresponds with the beam drift at the writing surface, i.e. substrate 204.

Figure 3:
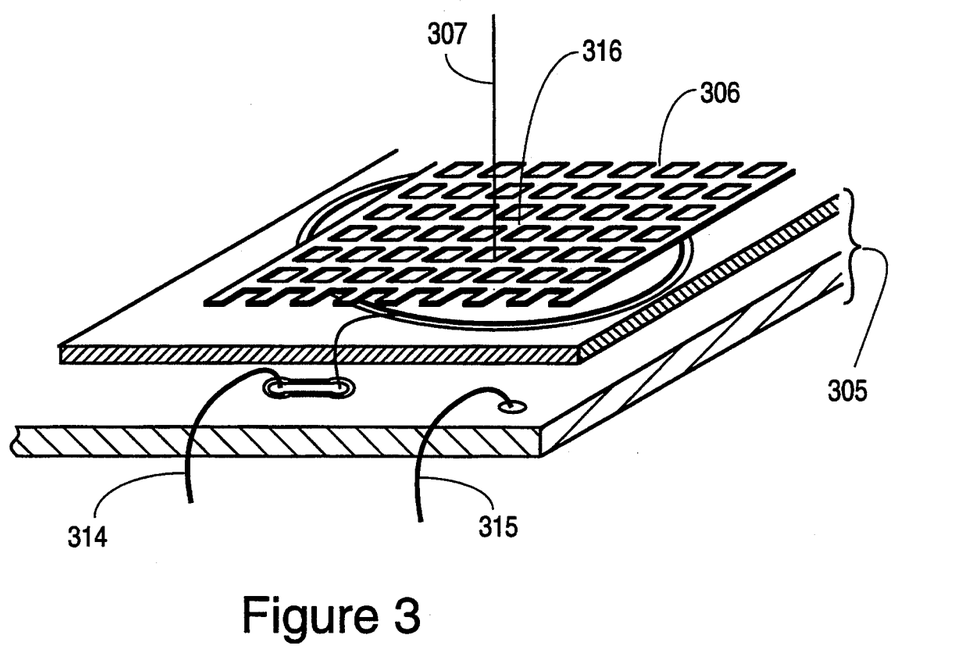
FIG. 3 shows a cutaway view of a stage grid and a photodiode detector.

An electronic calibration step is performed during step 103. The electronics of system 200, including electron detector 205, a charge amplifier 210, a digital control line 252, and ADC 211, generally have inherent, associated drift, noise and offset effects. These effects are determined and factored out of the measured beam current in accordance with the present invention. In step 103, a single grid cross 316 (FIG. 3), which may be one of several thousand grid crosses on stage grid 306, is arbitrarily chosen. An arbitrary grid cross 316 is satisfactory because the position of electron beam 307 and the position of stage grid 306 are based on relative distances, i.e., drift of electron beam 307 from an original starting location. Note that electrical connections 314 and 315 couple photodiode 305, positioned under stage grid 306, to a charge amplifier (explained in detail in reference to FIGS. 5 and 6) and to a voltage source Vbias, respectively.

Electron detector 205 is located under stage grid 206 to detect electrons of electron beam 207. In this embodiment of the present invention, electron detector 205 is a photodiode. In other embodiments, electron detector 205 is any type of high gain electron detector such as: a photoconductive detector (also called a phototube), a scintillator, or a positive intrinsic negative (PIN) diode. For simplicity, electron detector 205 is hereinafter referred to as photodiode 205. Photodiode 205 acts as a current amplifier which typically has a current gain between 500 and 5000. The actual gain varies according to the construction of the photodiode elements and the electron beam accelerating voltage. Because single pixel exposures result in extremely low charge transference, a high current gain for photodiode 205 is preferred.

Figure 5:
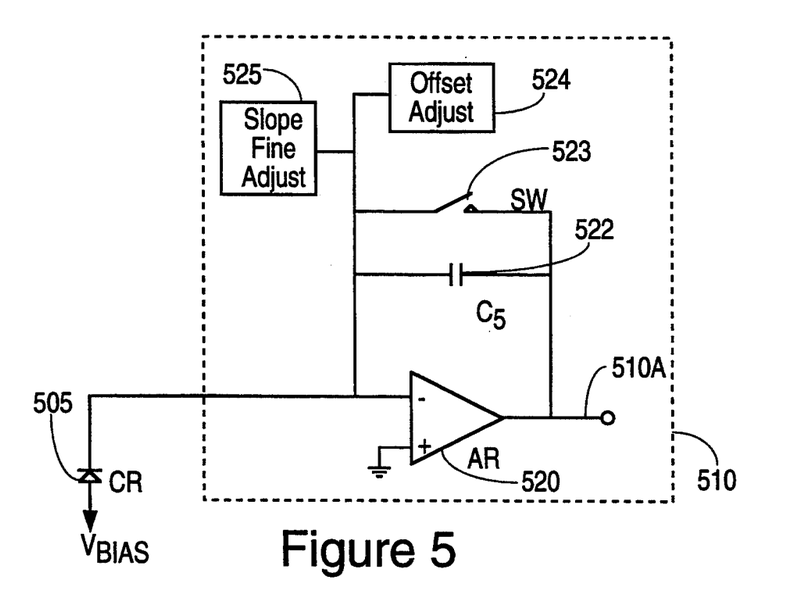
FIG. 5 shows a schematic of a charge amplifier.

The current generated by photodiode 505, which includes the amplified beam current and residual diode leakage current, is provided to charge amplifier 510 as shown in FIG. 5. Charge amplifier 510, includes an operational amplifier 520, a capacitor 522, an analog switch 523, an offset adjust 524, and a slope fine adjust 525. Photodiode 505 is coupled to the inverting input terminal of operational amplifier 520, whereas the non-inverting input terminal of operational amplifier 520 is coupled to a voltage source which is typically ground. A small reverse bias voltage of typically $-5$ to $-20$ volts is applied to photodiode 505 to reduce the photodiode capacitance and improve the response of operational amplifier 520.

Charge amplifier 510 has two operational modes: the reset mode and the integrate mode. In the reset mode, analog switch 523 is closed and integrating capacitor 522 is discharged, thereby providing a signal on the output line 510A of approximately zero volts. In the integrate mode, the signal on output line 510A depends on the charge provided by photodiode 505. Specifically, the signal on output line 510A of amplifier 520A typically steps in a positive voltage direction ($\Delta$Vout) according to the current generated by electron beam 207 (FIG. 2), the efficiency of photodiode 505, and the value of integrating capacitor 522. Specifically, $$\Delta Vout = PBC \times PT \times Gd \times \frac{1}{Cf} \quad \text{(Eq. 1)}$$

where
PBC = primary beam current,
PT = pixel time,
Gd = current gain of photodiode, and
Cf = integrating capacitor value.

For example, if the primary beam current (PBC) is 100 nanoamperes, the pixel time (PT) is 12.5 nanoseconds, the current gain of the photodiode (Gd) is 500, and the integrating capacitor value (Cf) is 15 picofarands, then Equation 1 yields:

$$\Delta VOUT = \quad \text{(Eq. 2)}$$

$$100 \text{ nanoamperes} \times 12.5 \text{ nanoseconds} \times \frac{1}{15pF} = 42 \text{ mV}$$

Thus, using the illustrative values shown in Equation 2, the voltage output Vout of operational amplifier 520 (in the integrate mode) steps 42 millivolts in the positive voltage direction with each pixel exposure. The voltage on output line 510A increases until operational amplifier 520 saturates. However, under normal conditions, the pixel exposure is halted before saturation is reached.

Noise, residual leakage current, and integration time (as related to throughput) place practical limits on the integration time. Typically, 32 single-pixel charge packets provide an appropriate output voltage for operational amplifier 520. Multiplying the illustrative $\Delta$Vout of 42 mV times 32 charge packets yields an output voltage of approximately 1.3 volts.

To calibrate the electronics, the electron beam is completely blanked to substantially eliminate incident electrons on photodiode 505. Charge amplifier 520 is placed in the integrate mode for a time equivalent to, for example, 32 raster scans (i.e. the total number of charge packets). After that time period, ADC 211 (FIG. 2) converts the output voltage of amplifier 520 to a digital signal which is then sent to and stored in control computer 212. This stored value represents the zero beam value.

Amplifier 520 is reset for several microseconds and then set to the integrate mode. The single pixel identified to be calibrated is then exposed. All remaining pixels are blanked. This pixel is exposed for N scans, where N is the number of raster scans (32 in this example). The single pixel exposure essentially creates a stationary beam which is "strobed" on every 32 microseconds. After the identified pixel is exposed for N scans, electron beam 207 is once again fully blanked, and ADC 211 converts the output voltage of operational amplifier 520 to a digital signal. This digital signal, also stored in control computer 212, represents the uncorrected full beam current value. The zero beam value (i.e. residual error) is subtracted from the uncorrected full beam current value to provide a corrected full beam current value. Subsequent beam current measurements are based on the percentage of this corrected full beam current value.

Figure 4:
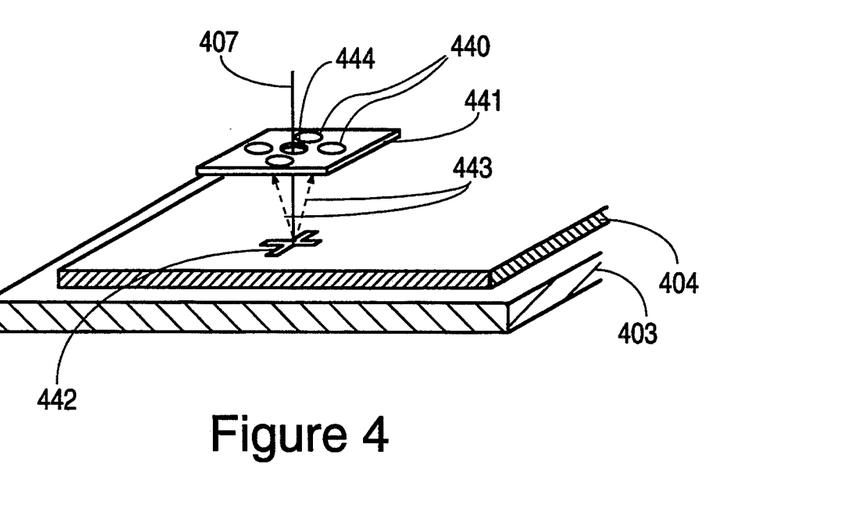
FIG. 4 illustrates another embodiment of the present invention in which backscattered electrons are intercepted from a target on the substrate.

In another embodiment of the present invention shown in FIG. 4, the calibration of the electronics is performed with substrate 404 itself resting on stage 403. In this embodiment, during zero beam calibration (more commonly referred to as offset reference calibration), unblanked electron beam 407 passes through aperture 444 in plate 441 and impacts the substrate 404 adjacent reflective mark 442. Charge amplifier 520 (FIG. 5), which is coupled to electron detectors 440, is then placed in an integrate mode for the predetermined time period. Subsequently, ADC 520 converts the output signal from charge amplifier 520 to a digital signal, and provides this digital signal to control computer 212.

During full beam current measurement, unblanked electron beam 407 passes through aperture 444 in plate 441 and impacts reflective mark 442 which has a known placement. Reflective mark 442 is typically fabricated from chrome, although any reflective, metallic material which is compatible with the substrate-making process (such as gold or platinum) may be used. Backscattered electrons 443 from electron beam 407 are detected by photodiode electron detectors 440 which are placed on the underside of plate 441. In the configuration shown in FIG. 4, four photodiode electron detectors 440 are used to improve the signal collection area.

The signal from these detectors 440, integrated by charge amplifier 210 and converted by ADC 211, is provided to control computer 212. Thus, in this embodiment of the present invention, stage grid 306 (FIG. 3) is eliminated. Moreover, because the beam measurement is taken on the substrate itself, this embodiment provides significantly increased accuracy compared to an embodiment including a stage grid placed adjacent the substrate.

Figure 16A:
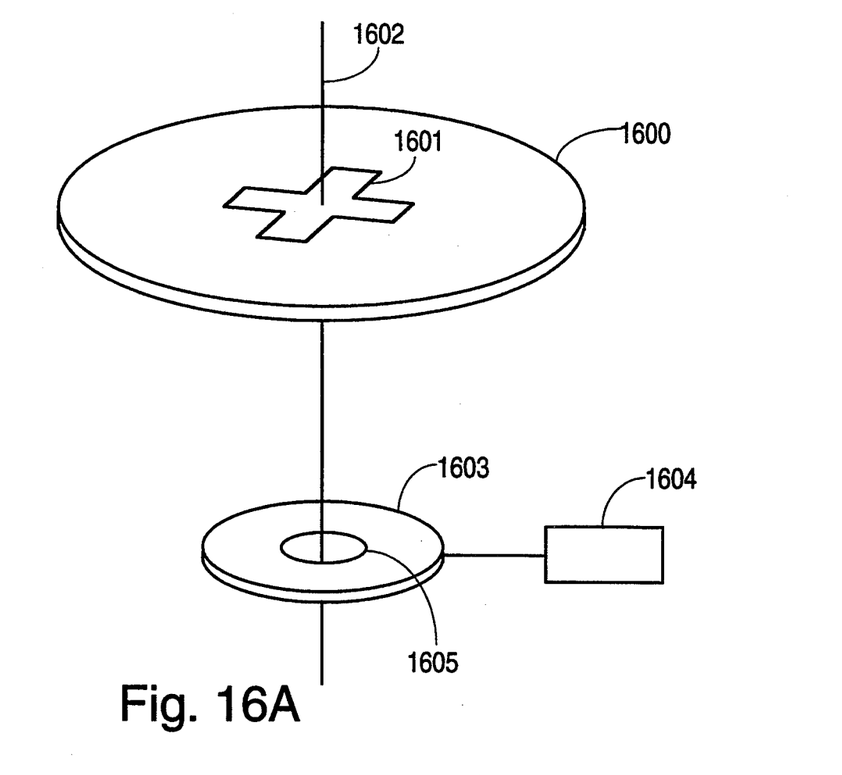
FIGS. 16A and 16B illustrate a beam transmission system in which the primary beam passes through a substrate.
Figure 16B:
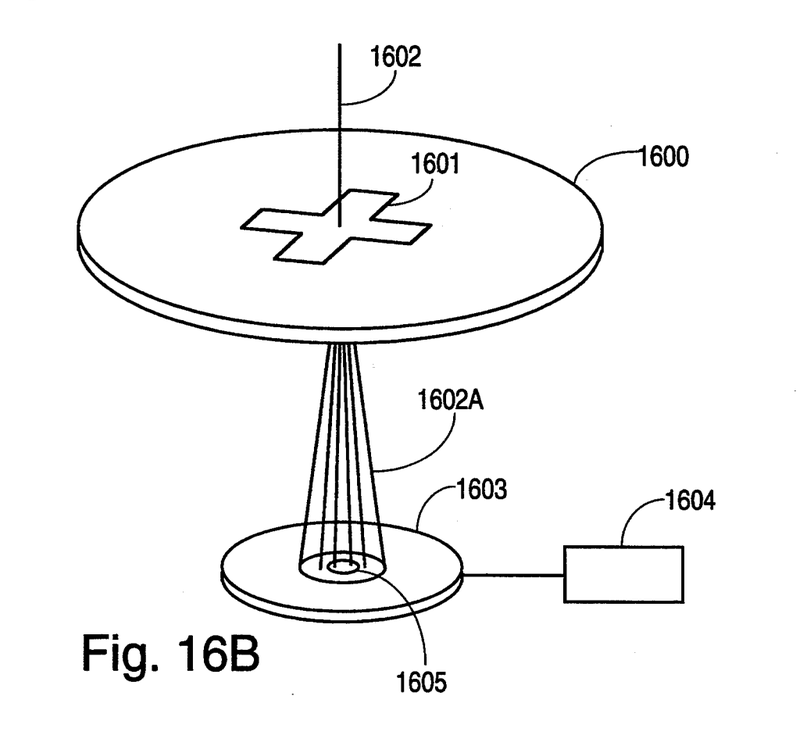

In yet another embodiment of the present invention shown in FIG. 16A, the primary electron beam 1602 passes through the substrate 1600 relatively unimpeded. Typically, substrate 1600 is fabricated from silicon and has a thickness of approximately 50 nm. However, if beam 1601 passes over reference mark 1601 as shown in FIG. 16B, the transmitted beam 1602A experiences angular scattering. Beam detector 1603, positioned below substrate 1600 to detect the scattering, typically includes an annular receiver for large incident beam currents (of, for example, 1 μA) or a conventional photodiode for smaller beam currents. The central hole 1605 permits the primary, electron beam 1602, transmitted through substrate 1600, to pass through beam detector 1603 without scattering, thereby providing no signals to charge amplifier 1604. U.S. Pat. No. 5,079,112, issued to Berger on Jan. 7, 1992, provides additional details regarding the method of viewing marks by transmission instead of reflection, and is herein incorporated by reference in its entirety.

Figure 6:
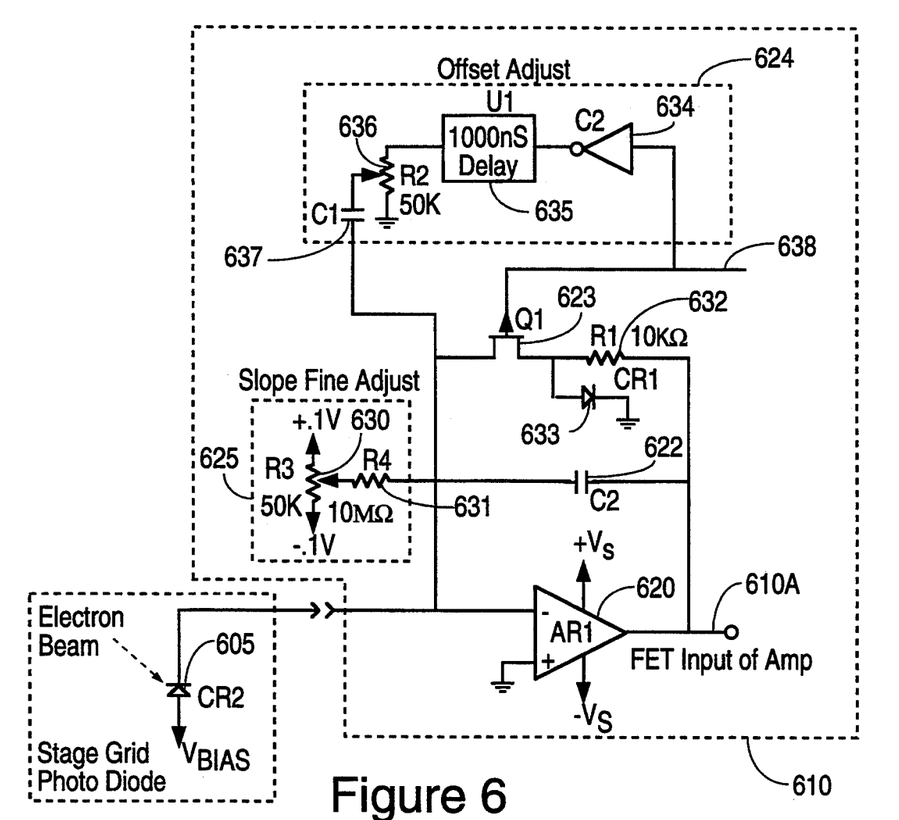
FIG. 6 illustrates another schematic of a charge amplifier.

FIG. 6 illustrates a detailed schematic of a charge amplifier 610. Referring to FIG. 6, operational amplifier 620 in one embodiment is a field effect transistor (FET) input operational amplifier which provides very low input error currents, for example 1 nanoampere, and provides sufficient output drive capability, i.e. up to 10 volts, to operate nominal interface electronics.

Transistor 623 functions as a low leakage analog switch which allows capacitor 622, an integrating feedback capacitor, to be discharged during the reset mode. Typically a near zero voltage on the gate of transistor 623 forces a reset mode, and a high voltage of, for example, 3 to 6 volts on the gate of transistor 623 places operational amplifier 620 in an integrate mode (i.e. transistor 623 is non-conducting).

Diode 633, operating with resistor 623, limits the drain voltage on transistor 623 to ensure the drain voltage does not exceed the gate voltage of transistor 623 during the integrate mode. Note that if the drain voltages were to exceed the gate voltage, the gate-drain junction of transistor 623 would be forward biased and normal operation could not occur. Resistor 632 presents a minimum load (for example 10K) on the output line of operational amplifier 620, yet is low enough to offer a rapid discharge of capacitor 622.

Trimpot resistor 630 and fixed resistor 631, referenced as slope fine adjust 625, cancel leakage currents generated by photodiode 605 or stray leakage from operational amplifier 620, for example. In other embodiments of the present invention, trimpot resistor 630 is replaced with a digital-to-analog converter (DAC) which allows computer control of the leakage cancellation. Slope fine adjust 625 is set such that if no electron beam is provided, the integrated output slope (explained in detail below) is minimum.

Offset adjust 624, which includes inverter 634, delay 635, trimpot resistor 636 and capacitor 637, is controlled manually by the user or electronically by the computer. Offset adjust 624 minimizes voltage offsets due to leakage from photodiode 605 or charge injection from analog switch 623 during reset-integrate transitions (via capacitive coupling of the reset control line 638). For example, as transistor 623 switches state, a small amount of charge is transferred from the reset control line 638 to integrating capacitor 622. This charge appears as an offset error, but is effectively canceled by introducing a complementary charge via offset adjust circuit 624. Inverter 634 inverts the signal on line 638, delay 635 delays this inverted signal (for example by 1000 nanoseconds), and capacitor 637 injects a charge to capacitor 622. Trimpot resistor 636 provides fine contort of this signal and is adjusted such that the overall offset charge transfer is minimal. In another embodiment of offset adjust circuit 624, resistor 636 is replaced with a DAC (not shown) which is operated by control computer 212 (FIG. 2).

Referring to FIGS. 1 and 2, after calibration of the electronics in step 103, electron beam 207 is stepped across stage grid 206 towards the X-axis in step 104. Step 104 includes substeps 104A–104F. In sub-step 104A, after electron beam 207 is turned fully on, i.e. providing a maximum signal to photodiode 205, charge amplifier 210 is reset and then set to the integrate mode. In sub-step 104B, electron beam 207 is unblanked for one pixel for 32 raster scans. Then, in sub-step 104C, the voltage output of charge amplifier 210 is converted to a digital signal (by ADC 211) and stored in control computer 212.

In step 104D, charge amplifier 210 is reset and set to integrate. Subsequently, electron beam 207 is stepped via a small summing deflection signal 250A in the Y beam deflector 251A towards the X axis grid 703, as shown by arrow 701 in FIG. 7. The summing signal 250A normally generates a deflection via Y-beam deflector 251A from 0.005 microns (or less) for a fine calibration to several microns for a coarse calibration. Then, in step 104E, N exposures are made of the same pixel, i.e. electron beam 207 is strobed, thereby creating in effect a stationary beam. Note that the signal from each exposure is inherently fast and small in value, thereby making accurate measurement extremely difficult. Therefore, in accordance with the present invention, charge amplifier 210 accumulates packets of charge from each exposure to develop an appropriate output signal. The output signal from charge amplifier 210 is digitized and finally stored in control computer 212 in step 104F. Steps 104D–104F are reiterated until electron beam 207 is totally on top of stage grid 206, i.e., the output signal is approximately the "zero" current value.

Figure 7:
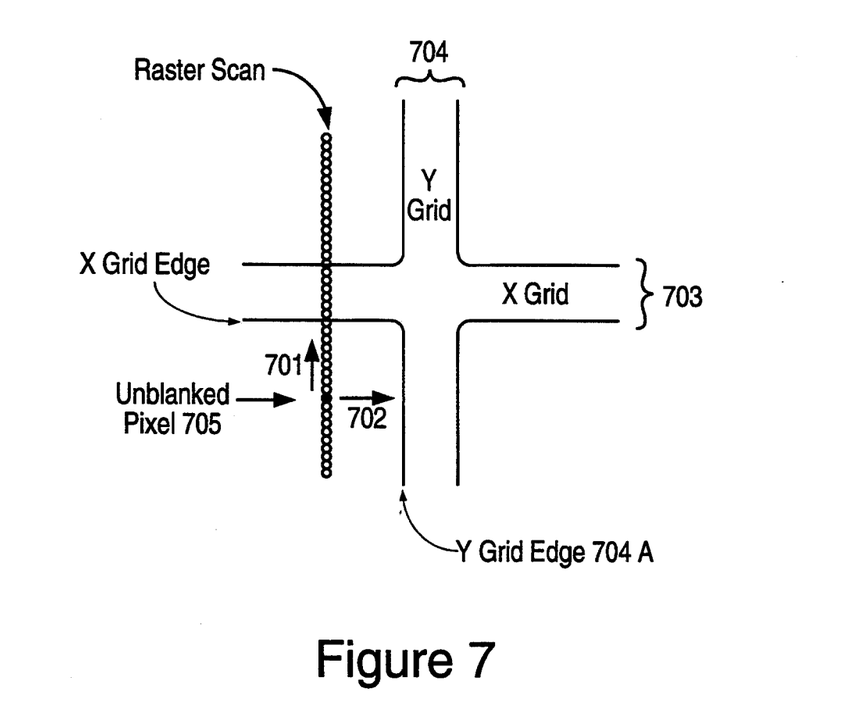
FIG. 7 shows a pictorial representation of the raster beam with one unblanked pixel before it is scanned across a single cross of the stage grid.
Figure 8:
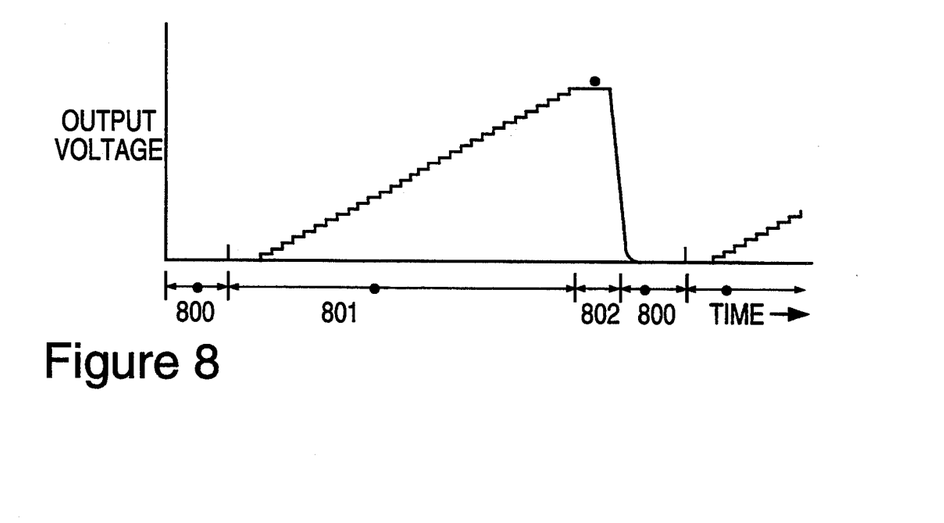
FIG. 8 illustrates a graph of the voltage signal output of the charge amplifier versus the output voltage during a typical measurement cycle.
Figure 9:
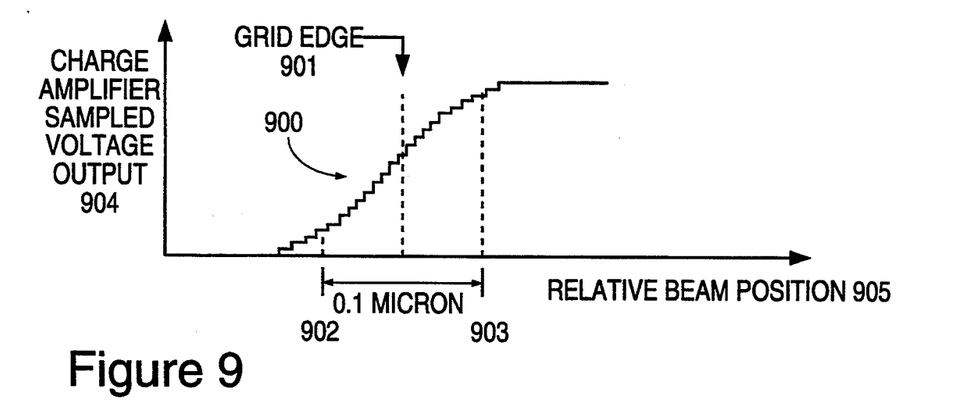
FIG. 9 shows a spatial distribution graph representing charge amplifier voltage output versus electron beam position.
Figure 10:
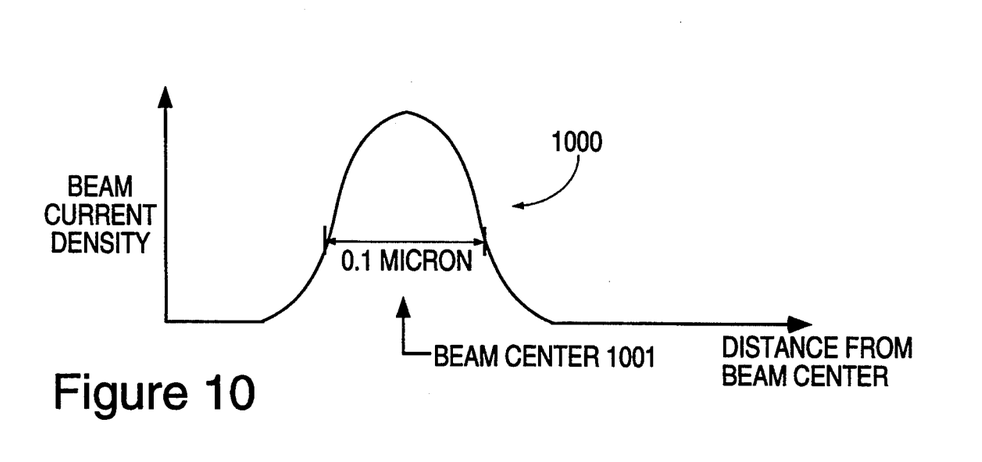
FIG. 10 illustrates a typical electron beam current profile in a graph plotting beam current density versus distance from beam center.

Thus, referring to FIG. 8, during a single pixel integration within a single beam step, charge amplifier 210 is reset during time period 800, the output voltage from charge amplifier 210 is integrated during time period 801, and ADC 211 converts this integrated signal during time period 802. The digitized output voltages of successive beam steps 900 are illustrated in FIG. 9. Specifically, FIG. 9 shows the voltage outputs of an electron beam 207 (FIG. 2) which was stepped towards and across the X axis grid 703 (FIG. 7) in increments of 0.005 microns. A conventional electron beam (which projects a rounded image) generates less current (via photodiode 205) the greater the distance from the beam center. Thus, as shown by waveform 1000 in FIG. 10, the electron beam current density is approximately halved at 0.05 microns from the beam center 1001. Referring to FIGS. 9 and 10, grid edge 901 is determined to be the relative beam position 905 substantially at the mid-point (i.e. 50%) of the sampled voltage output 904. Points 902 and 903 indicate the relative beam position 905 0.05 microns from beam center 1001 which in turn corresponds to grid edge position 901. The relative location of electron beam 207 crossing stage grid 206 is determined in step 105 (FIG. 1) using the known increment deflection for each step 900. In this manner, the position of X-grid 703 is determined. This grid location is a relative location and is principally used to determine beam drift over a period of time or temperature. Specifically, if there is no beam drift, then the same applied deflection will result in the same amplifier output voltage plot. Thus, this first calibration measurement is used as a reference point, and all subsequent calibration measurements are compared to this reference point.

Referring to FIGS. 1, 2 and 7, a similar process is performed in steps 106A–106F to determine the relative location of the Y grid, using small incremental deflections in the X deflection drive 251B until the beam is detected crossing the Y grid edge 704A. Note that after both the X and Y grid positions are known, the position of substrate 204 (FIG. 2) is also known.

The present invention uses conventional data reduction techniques to determine the position of the X and Y grids. Specifically, if electron beam 307 (FIG. 3) is fully on photodiode 305 or totally on stage grid 306, relatively little information relating to beam position is obtained. However, critical data are obtained as electron beam 307 crosses the edge of the grid, i.e. X grid edge 703A or Y grid edge 704A (FIG. 7). Thus, computer software typically minimizes the amount of time spent deflecting the pixel away from stage grid 306. Conventional software, for example either a Gaussian curve fitting routine (for single pixel applications) or a least squares fitting routine (for multiple pixel applications), determines the exact position of electron beam 307 by using the beam-on-edge data. In one embodiment, the software determines the midpoint of electron beam 307 (see FIGS. 9 and 10), whereas in other embodiments the software provides a digital signal processing scheme to increase accuracy by determining other percentages of sampled output voltage in addition to the 50% voltage output. These values are fit on curve 900 which is assumed to be uniform for each strobing cycle.

In step 108, the next pixel to be calibrated is chosen. Then steps 101–107 are repeated until the last pixel is calibrated. For each pixel, stage grid 206 is repositioned to a new calibration site via stage position controls 201A and 201B. In another embodiment, electron beam 207 is moved via beam deflectors 251A and 251B. The relative location of each stage grid position is precisely known because of the operation of the system 202 which includes laser interferometer 212, vibration correction 213, and stage position control 201. Because the incremental deflection summation signal 250 is precisely known (via low speed calibration) as well as the position of stage grid 203, the position of each pixel is accurately determined in the present invention.

Figure 11A:
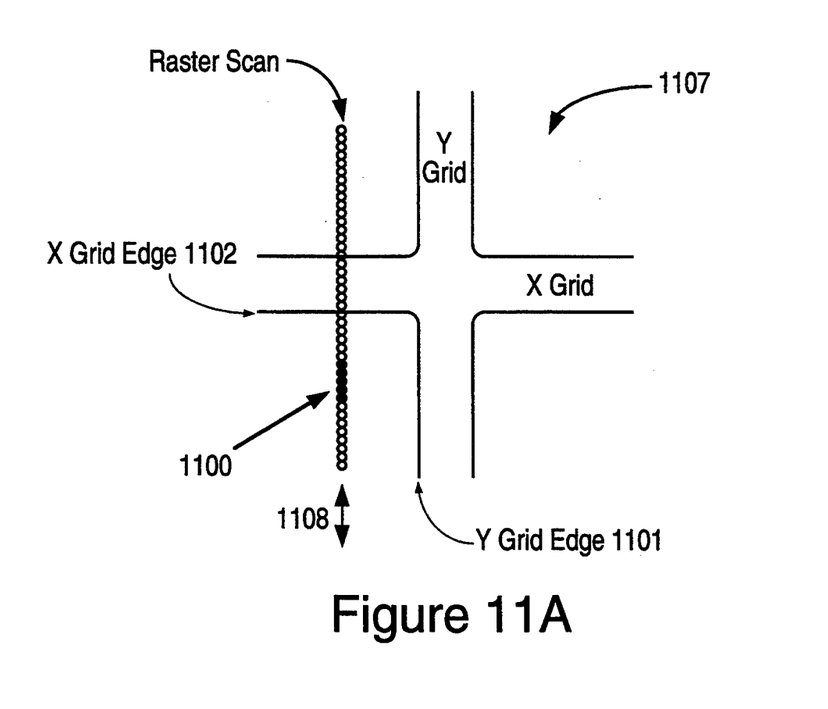
FIG. 11A shows another embodiment of the present invention in which several contiguous pixels are unblanked in the raster beam.
Figure 11B:
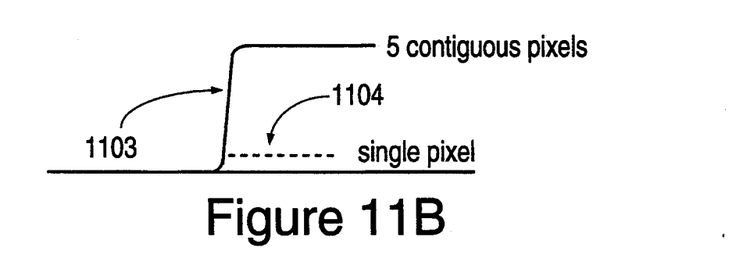
FIG. 11B illustrates typical waveforms produced by a group of five contiguous pixels as well as a single pixel scanned across a Y-grid.

In accordance with another embodiment of the present invention, the signal to noise ratio is significantly improved by exposing several contiguous pixels as shown in FIG. 11A for a single cross of the stage grid. In this embodiment, it is assumed that any non-linearity errors within the pixel group are negligible. As pixel group 1100 (a group of 5 pixels, for example) is slowly stepped across the grid 1107, the output signal from the charge amplifier (not shown) depends on the stepping direction. If the normal raster scan is in the Y direction (indicated by arrows 1108), stepping pixel group 1100 in the X-direction across Y grid edge 1101 produces a waveform 1103 shown in FIG. 11B. The signal profile, i.e. waveform 1103, is substantially identical to a "single-pixel" waveform 1104; however, the maximum signal amplitude is N times the single pixel amplitude, where N is the number of contiguous pixels exposed. Because all pixels within group 1100 are assumed to be linear, the position of an individual pixel is determined using conventional data interpolation methods.

Figure 11C:
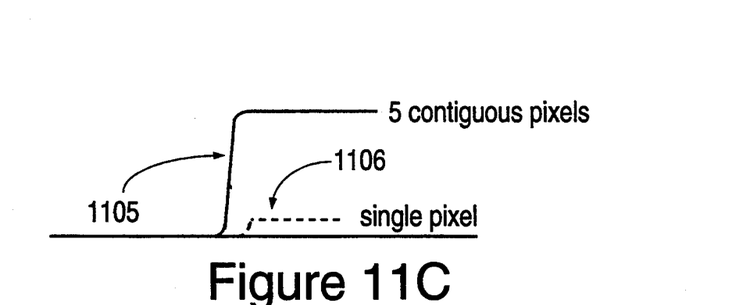
FIG. 11C illustrates typical waveforms produced by a group of five contiguous pixels as well as a single pixel scanned across an X-grid.

Pixel group 1100 is stepped across X-grid edge 1102 for a distance of N pixels to achieve the full output signal. Once again, the center of each pixel in pixel group 1100 is determined by interpolating the data from the accumulated signals as shown in FIG. 11C. Note that this waveform is illustrative only if the X grid is much wider than pixel group 1100.

Figure 12A:
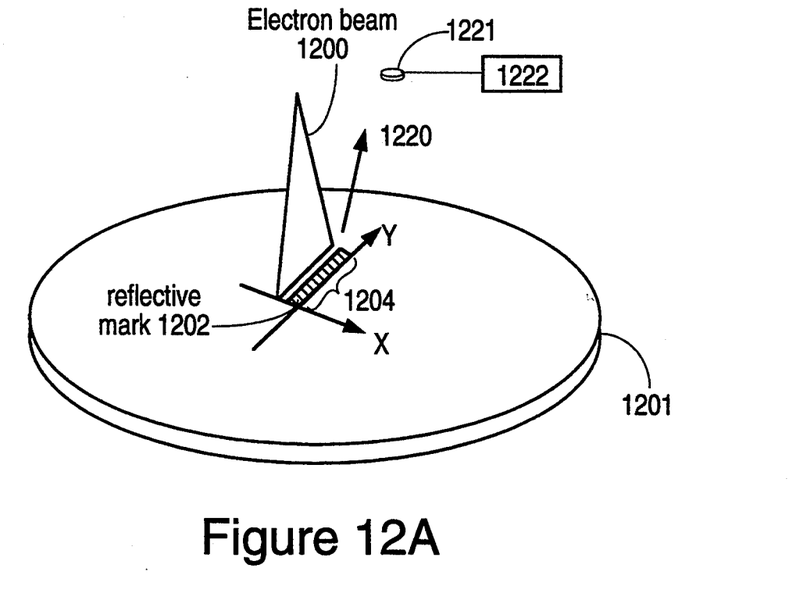
FIG. 12A shows a perspective view of an electron beam reflecting off a reflective mark on a substrate.
Figure 12B:
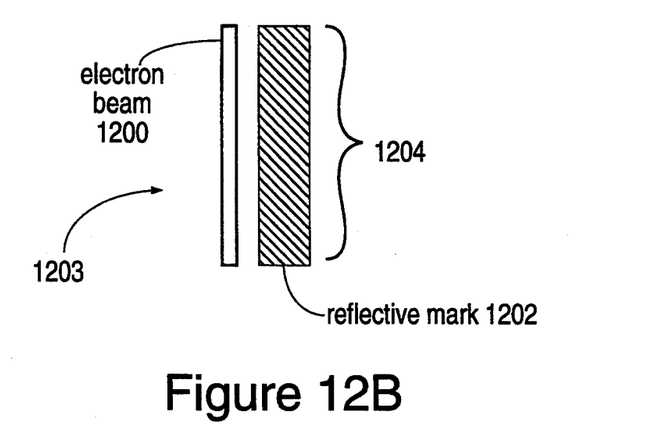
FIG. 12B illustrates a top view of the electron beam and the reflective mark shown in FIG. 12A.
Figure 12C:
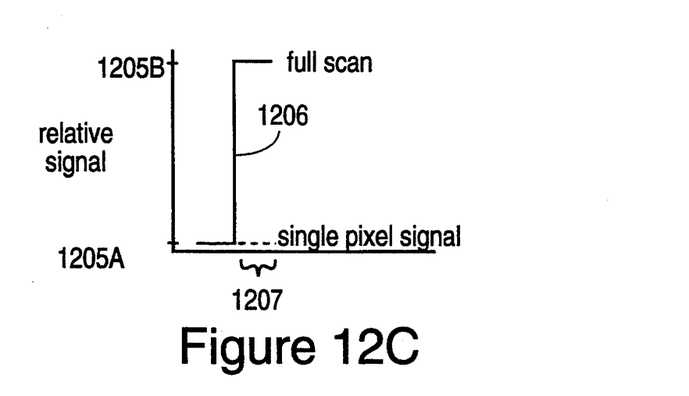
FIG. 12C shows a graph of relative signal voltage versus distance of the electron beam scanned across the reflective mark in FIG. 12B.
Figures 13A, 13B, 13D:
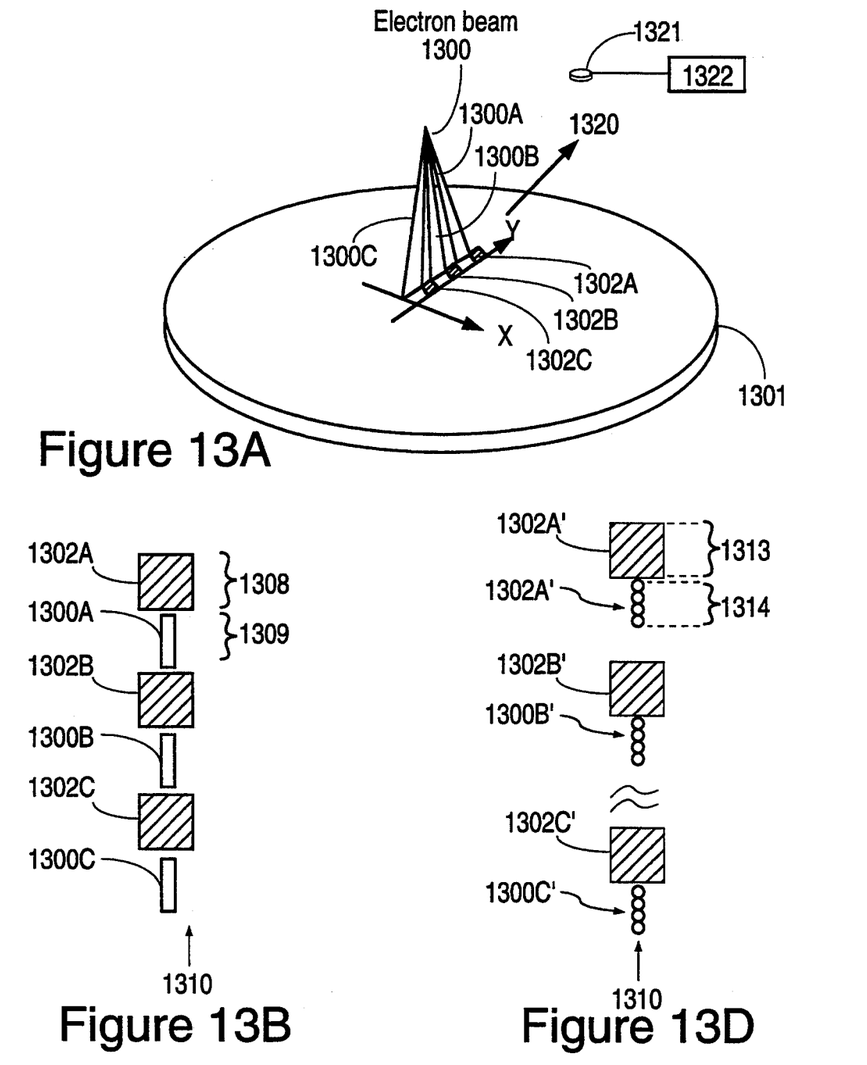
FIG. 13A illustrates a perspective view of a plurality of electron beam fingers reflecting off a series of reflective segments on a substrate.
FIG. 13B shows a top view of the electron beam fingers and the series of reflective segments shown in FIG. 13A.
FIG. 13D illustrates a top view of a plurality of electron beam fingers and a plurality of reflective segments in accordance with another embodiment of the present invention.
Figure 13C:
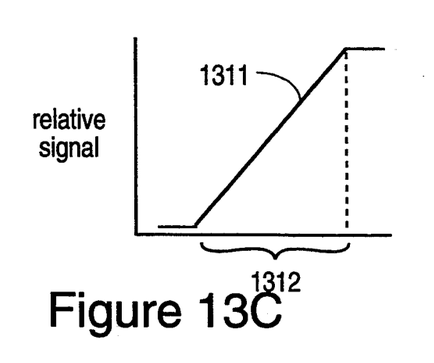
FIG. 13C shows a graph of relative signal voltage versus distance, if the electron beam fingers are scanned across the series of reflective segments in FIG. 13B.
Figure 13E:
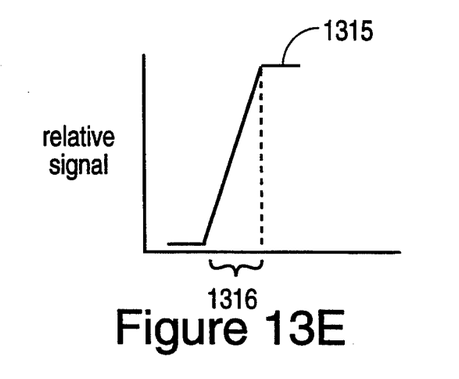
FIG. 13E shows a graph of relative signal voltage versus distance, if the plurality of electron beam fingers are scanned across the plurality of reflective segments in FIG. 13D.

In another embodiment of the present invention shown in FIGS. 12 and 13, the configuration of the electron beam and the reflective mark(s) are varied depending on whether the beam is stepped to measure the X-location or the Y-location of the substrate. FIGS. 12A and 12B illustrate an electron beam 1200 which is stepped in a direction 1203 across a reflective mark 1202 to measure the Y-position of substrate 1201. Reflective mark 1202 has a typical length 1204 of 1024 $\mu$m. Stepping beam 1200 across reflective mark 1202 produces backscattered electrons 1220 which are subsequently detected and accumulated by electron detector 1221 and charge amplifier 1222, respectively (see also FIG. 4). The charge packets, integrated by charge amplifier 1222, yield a waveform 1206 shown in FIG. 12C which at full scale has a relative signal value 1205B of, for example, of 10V, and at a single pixel has a relative signal value 1205A of, for example, 5 mV. Charge amplifier 1222 rapidly reaches full scan value 1205B after distance 1207 which is typically 0.5 $\mu$m. This method of determining the X-location provides the following advantages compared to the single pixel scan as described above: a sharper signal as beam 1200 steps over the edge of reflective mark 1202, an improved signal to noise ratio, and a decreased sensitivity to irregularities (for example, bumps) on reflective mark 1202 (i.e. a plurality of pixels tends to average out these irregularities over the length of the scan).

FIGS. 13A and 13B illustrate an electron beam 1300 which includes a plurality of beam fingers. In this embodiment, three beam fingers 1300A–1300C are provided to step in a direction 1310 to determine the Y-location of substrate 1301. Fingers 1300A–1300C are stepped across reflective markers 1302A–1302C, respectively. Note that the length 1309 of a finger 1300, for example finger 1300A, is less than the length 1308 of a reflective marker 1302, for example 1302A. Typically, length 1309 of finger 1300 is approximately 150 $\mu$m whereas the length 1308 of marker 1302 is approximately 200 $\mu$m. Stepping beam 1300 across the plurality of reflective markers 1302 produces backscattered electrons 1320 which are detected and accumulated via electron detector 1321 and charge amplifier 1322. Charge amplifier 1322 provides a waveform 1311, shown in FIG. 13C, which reaches full scan value after a distance 1312 which corresponds to the length of finger 1300 (in this embodiment 150 $\mu$m).

In a variation of the embodiment described in reference to FIGS. 13A and 13B, fingers 1300A'–1300C' and reflective markers 1302A'–1302C' are significantly decreased in size. Specifically, the length 1314 of, for example, finger 1300B' is approximately 2.0 $\mu$m while the length 1313 of, for example, reflective marker 1302B' is approximately 2.5 $\mu$m. Note that the number of fingers 1300' and corresponding reflective markers 1302' in accordance with the present invention varies between 3 and 200. Charge amplifier 1322 provides a waveform 1315, shown in FIG. 13E, which attains full scale value after a distance 1316. Distance 1316 corresponds to the length 1314 of finger 1300' (in this embodiment 2.0 $\mu$m). This embodiment of the present invention provides the following advantages: small fingers 1300' allow sharper signal edges and improve accuracy over the embodiment shown in FIG. 13, and multiple fingers 1300' improve signal levels and average out small beam irregularities. The position of each pixel in fingers 1300' (FIG. 13D), fingers 1300 (FIG. 13B), or beam 1200 (FIG. 12) is determined by interpolation as described in detail above.

After determining the position of any pixel, any well-known data reduction technique is used to analyze beam deflection quality, i.e. linearity of raster scan in both X and Y deflection axes, raster scan length, and scan drift vs. time or temperature.

Thus, a beam parameter measurement system and method in accordance with the present invention provides significant advantages over prior art system/method which include, but are not limited to:

1. operation at a normal deflection rate, i.e. the deflection rate used during resist exposure, thereby increasing positional accuracy determination, 2. integration of multiple charge packets, thereby requiring lower gain amplifiers which improves signal to noise performance, 3. use of a charge amplifier which provides predictable waveform, thereby reducing the heretofore critical issue of timing, and 4. use of a reset function, thereby improving the throughput of repeated measurements and minimizing the time period before a new measurement can be taken. Prior art systems (i.e. those systems not providing a reset function), experience a time constant associated with the signal decay of a low pass filter. This settle time is typically 5 to 10 times greater than the time needed to acquire the signal. The present invention provides a reset function which allows an immediate zeroing of the signal, thereby eliminating the undesirable time constant found in the prior art.

Using characterizations of several pixels yields a variety of data tables. For example, the position of a single pixel tabulated as a function of time or temperature qualifies system drift. In another table, the positions of the end pixels (or pixels near the end of the scan) are tracked to monitor changes in raster scan length. In yet another table, the positions of multiple pixels are analyzed via well-known "least squares fit" curve fitting techniques to plot deviations from ideal linear placements of pixels.

In comparison to common raster scanning electron beam deflection systems, vector scanning systems pose unique challenges. The advantage of vector scanning systems appears in throughput performance by deflecting the beam only to areas where exposure is required. As with raster scanning, prior art vector scan calibrations have relied on slow speed, low frequency scanning techniques for coarse calibrations and actual pattern exposures and metrology for final calibrations. However, as mentioned earlier, these calibration methods are both time-consuming and expensive.

Unlike raster scanning systems, a vector scan deflection signal places the electron beam in patterns which are not repeatable and, in fact, vary in both the X and Y deflection axes. Moreover, in vector scan electron beam lithography systems, the concepts of pixels per scan and scan length do not apply. Thus, the transient behavior of the beam deflection is especially difficult to measure using conventional methods.

In other words, the question presented in a vector scan system is how fast, and accurately, can an electron beam be moved from one location to another location. In accordance with the present invention, the location of a vector scanned electron beam is determined as a function of time by controlling the beam blank/unblank signal. If the unblank signal is controlled, such that during the unblank time the electron beam deflection is minimal or insignificant, then for practical measurement purposes a stationary, "strobed" beam is created which is comparable to the single pixel exposure of the raster scan measurement technique.

Figure 14:
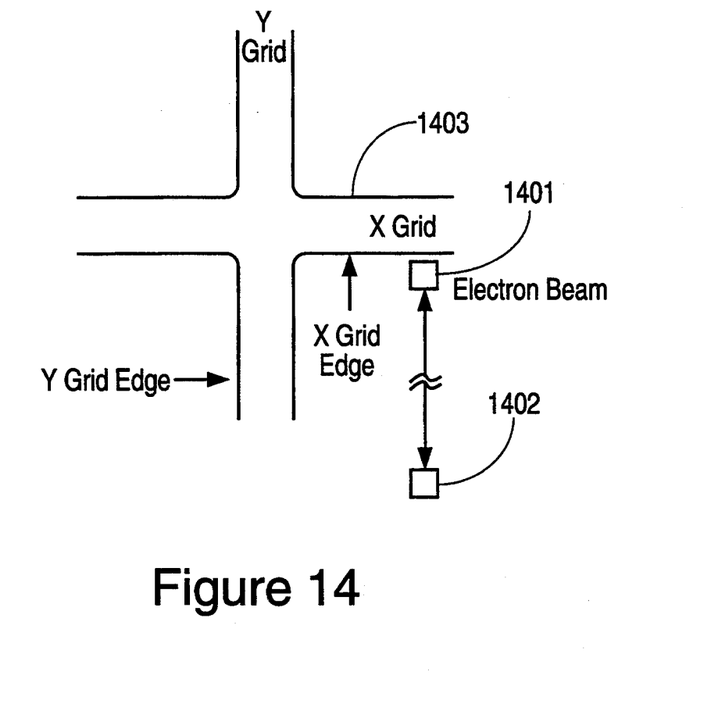
FIG. 14 illustrates an origin position and a destination position in a vector scan system.

For example, referring to FIG. 14, assume that position 1401 is the origin whereas position 1402 is the destination. When the electron beam moves from position 1401 to position 1402 there is some inherent overshoot and bounce-back before the beam settles to the destination position 1402. Therefore, in accordance with the present invention, as the beam is repeatedly moved between positions 1401 and 1402, the beam is unblanked at a predetermined time delay. This repeated unblanking creates the above-mentioned strobe. Then, the location of that time delay is determined by a method similar to the one described above in reference to FIG. 1 (i.e. the grid 1403 is moved close to the position and then the electron beam is stepped across the grid). After the location of the predetermined position is determined, another time delay is chosen for unblanking of the electron beam between positions 1401 and 1402. In this manner, a waveform 1505 (FIG. 15) is generated which illustrates the position of the electron beam as a function of time as the beam moves from original position 1401 to destination position 1402, i.e. the settling period 1503 of the defection system. Note that the reference point for each settling time measurement is the "beginning of step" point 1504, also referenced "T=0", in FIG. 15.

Figure 15:
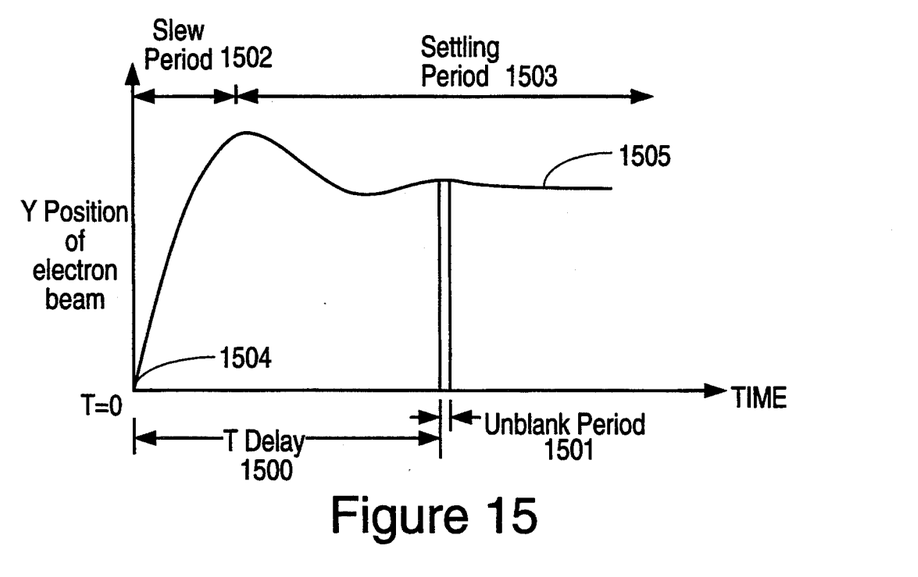
FIG. 15 shows a graph of electron beam position versus time in a vector scan system.

Thus, referring to FIG. 15, this technique aids in determining the position of the electron beam moments before the beam is unblanked for exposure during unblank time period 1501. During unblank time period 1501, the electron beam is still moving, but at a rate which will produce minimal measurement errors.

For example, if the settling deflection rate of an electron beam across a stage grid 1403 is 0.2 microns per microsecond, then during an unblank period of 50 nanoseconds, the electron beam will move 0.01 microns, which is typically an acceptable measurement error. In other embodiments, shorter unblank periods 1201 produce less measurement error.

Waveform 1505 is typically used as either a system-level diagnostics or as a means to develop error correction signals and correction algorithms.

Therefore, in a vector scan system in accordance with the present invention, the beam deflection is not cyclic (as in a raster scan system) during resist exposure, but the deflection signal is forced to be cyclic during beam parameter measurement, thereby representing the worst case deflection.

The above description is illustrative only and not limiting. Those skilled in the art will recognize other system and methods for electronically measuring scan deflection distortion in accordance with the present invention. For example, although the above-described embodiments of the present invention relate to measuring deflections of an electron beam, other embodiments relate to ion or laser beams. Moreover, the above-described method and structure in the present invention are equally applicable to both lithographic as well as metrology systems. The invention is set forth in the appended claims.

What is claimed is:

1. A method of electronically measuring parameters of a beam in a raster scan system comprising the steps of:
   (a) choosing a predetermined pixel of the raster scan to be calibrated;
   (b) moving a grid adjacent said pixel;
   (c) strobing said beam;
   (d) incrementally moving said beam toward a first axis of said grid;
   (e) integrating the signal resulting from said beam as said beam moves toward said first axis; and
   (f) repeating steps (c) through (e) until a predetermined value of said signal is reached, thereby indicating said beam has crossed said first axis.

2. The method of claim 1 further including the steps of:
   (g) strobing said beam;
   (h) incrementally moving said beam toward a second axis of said grid;
   (i) integrating the signal resulting from said beam as said beam moves toward second axis; and
   (j) repeating steps (g) through (i) until said beam crosses said second axis.

3. The method of claim 1 wherein an amplifier integrates said signal resulting from said beam.

4. The method of claim 3 further including the steps of: (b1) resetting said amplifier and (b2) setting said amplifier to an integrate mode.

5. The method of claim 1 wherein step (c) includes unblanking said predetermined pixel for N scans, where N is a predetermined integer.

6. The method of claim 1 further including the steps of (e1) converting a voltage output from said amplifier to a digital signal and (e2) storing said digital signal.

7. The method of claim 1 wherein step (a) includes choosing a plurality of pixels.

8. The method of claim 7 wherein said plurality of pixels are contiguous.

9. The method of claim 1 wherein said grid includes reflective segments on a substrate.

10. The method of claim 1 wherein said grid includes at least one scattering mark on a transmissive surface.

11. The method of claim 1 wherein said raster scan system is a lithographic system.

12. The method of claim 1 wherein said raster scan system is a metrologic system.

13. A method of electronically measuring parameters of a beam in a raster scan system comprising the steps of:
   (a) choosing a predetermined plurality of pixels of said raster scan to be calibrated;
   (b) moving at least one reflective mark adjacent said plurality of pixels;
   (c) strobing said beam;
   (d) incrementally moving said beam toward said at least one reflective mark;
   (e) integrating the signal resulting from said beam as said beam moves toward said at least one reflective mark; and
   (f) repeating steps (c) through (e) until said beam crosses said at least one reflective mark.

14. The method of claim 13 wherein said plurality of pixels are contiguous.

15. The method of claim 13 wherein said beam includes a plurality of beam fingers linearly positioned.

16. The method of claim 13 wherein said at least one reflective mark includes a plurality of reflective segments.

17. The method of claim 13 wherein said raster scan system is a lithographic system.

18. The method of claim 13 wherein said raster scan system is a metrologic system.

19. A method of electronically measuring parameters of a beam in a raster scan system comprising the steps of:
   (a) choosing a predetermined plurality of pixels of said raster scan to be calibrated;
   (b) moving at least one scattering mark on a transmissive surface adjacent said plurality of pixels;
   (c) strobing said beam;
   (d) incrementally moving said beam toward said at least one scattering mark;
   (e) integrating the signal resulting from said beam as said beam moves toward said at least one scattering mark; and
   (f) repeating steps (c) through (e) until said beam crosses said at least one scattering mark.

20. The method of claim 19 wherein said plurality of pixels are contiguous.

21. The method of claim 19 wherein said beam includes a plurality of beam fingers linearly positioned.

22. The method of claim 19 wherein said at least one scattering mark includes a plurality of scattering segments.

23. The method of claim 19 wherein said raster scan system is a lithographic system.

24. A method of electronically measuring parameters of a beam in a vector scan system comprising the steps of:
   (a) choosing an origin position and a destination position on said vector scan;
   (b) moving said beam between said origin position and said destination position;

(c) unblanking said beam at a predetermined time delay during step (b);

(d) repeating steps (b) and (c) for N times, where N is a predetermined integer;

(e) incrementally increasing the value of said predetermined time delay; and (f) repeating steps (b) through (e) until said beam has settled at said destination position.

25. The method of claim 24 wherein said vector scan system is a lithographic system.

26. A system for electronically measuring beam parameters for substrate patterning comprising:

means for positioning said substrate;

a detector secured to said means for positioning;

a grid positioned over said detector;

a charge amplifier coupled to said detector; and means for transferring a signal from said charge amplifier to said means for positioning.

27. The system of claim 26 wherein said charge amplifier comprises:

an operational amplifier;

a capacitive element coupled in parallel with said operational amplifier;

means for switching coupled in parallel with said operational amplifier;

an offset adjust coupled in series with said means for switching; and a slope fine adjust coupled between said offset adjust and said means for switching.

28. The system of claim 27 wherein said detector is coupled to the inverting input terminal of said operational amplifier.

29. The system of claim 28 wherein a first voltage source is coupled to the non-inverting input terminal of said operational amplifier.

30. The system of claim 29 wherein said offset adjust and said slope fine adjust are coupled to said inverting input terminal of said operational amplifier.

31. The system of claim 26 wherein said system is a lithographic system.

32. The system of claim 26 wherein said system is a metrologic system.

33. A system for electronically measuring parameters of a beam comprising:

a substrate having a reflective mark thereon;

a detector positioned over said substrate;

a charge amplifier coupled to said detector;

means for positioning said substrate; and means for transferring a signal from said charge amplifier to said means for positioning.

34. The system of claim 33 wherein said system is a lithographic system.

35. The system of claim 33 wherein said system is a metrologic system.

36. A system for electronically measuring parameters of a beam comprising:

a transmissive surface having a scattering mark thereon;

a detector positioned under said surface;

a charge amplifier coupled to said detector;

means for positioning said surface; and means for transferring a signal from said charge amplifier to said means for positioning.

37. The system of claim 36 wherein said system is a lithographic system.

38. The system of claim 36 wherein said system is a metrologic system.

* * * * *